United States Patent
Yoo

(10) Patent No.: US 7,037,826 B2
(45) Date of Patent: May 2, 2006

(54) METHOD FOR FORMING SEMICONDUCTOR DEVICE BONDING PADS

(75) Inventor: Seung Jong Yoo, Gyeonggi-do (KR)

(73) Assignee: DongbuAnam Semiconductor, Inc., (KR)

( * ) Notice: Subject to any disclaimer, the term of this patent is extended or adjusted under 35 U.S.C. 154(b) by 117 days.

(21) Appl. No.: 10/747,603

(22) Filed: Dec. 29, 2003

(65) Prior Publication Data
US 2004/0142549 A1   Jul. 22, 2004

(30) Foreign Application Priority Data
Dec. 31, 2002   (KR) .................. 10-2002-0088279

(51) Int. Cl.
*H01L 21/4763* (2006.01)
(52) U.S. Cl. .................. 438/637; 438/687
(58) Field of Classification Search .............. 438/614, 438/622, 637, 687
See application file for complete search history.

(56) References Cited

U.S. PATENT DOCUMENTS 6,245,380 B1 * 6/2001 Sun et al. .................. 216/17
6,358,831 B1 * 3/2002 Liu et al. .................... 438/612
6,376,353 B1   4/2002 Zhou et al. ................. 438/612
6,465,895 B1 * 10/2002 Park et al. ................... 257/782
6,560,862 B1   5/2003 Chen et al. ................... 29/843

\* cited by examiner

*Primary Examiner*—Chandra Chaudhari
(74) *Attorney, Agent, or Firm*—Saliwanchik, Lloyd & Saliwanchik

(57) ABSTRACT

A method of forming a bonding pad of a semiconductor device is disclosed. An example method forms a first insulating layer over a semiconductor substrate, forms a trench by removing some part of the first insulating layer, forms a top metal interconnect in the trench, forms a second insulating layer over the substrate including the top metal interconnect, and forms a contact hole by removing some part of the second insulating layer, the contact hole exposing a portion of the top metal interconnect. In addition, the example method forms a metal layer on the surface of the second insulating layer and the sidewalls and bottom of the contact hole, forms a metal pad by removing some parts of the metal layer, forms a third insulating layer over the second insulating layer and the metal pad, and exposes the metal pad on the second insulating layer by removing some part of the third insulating layer.

7 Claims, 2 Drawing Sheets

METHOD FOR FORMING SEMICONDUCTOR DEVICE BONDING PADS

FIELD OF THE DISCLOSURE

The present disclosure relates generally to semiconductor devices and, more particularly, to a method for forming a bonding pad of a semiconductor device with copper interconnect.

BACKGROUND

In a conventional wire bonding pad structure of a semiconductor device, bonding pads are directly in contact with a top metal interconnect. For example, U.S. Pat. No. 6,560,862 to Chen et al. discloses a method for fabricating a bonding pad structure. The method disclosed by Chen et al. provides a substrate having a top metal layer and a passivation layer overlying the top metal layer, etching the passivation layer within a metal via area to form a trench exposing at least a portion of the top metal layer, and forming a patterned, extended bonding pad over the etched passivation layer and lining the trench. In another example, U.S. Pat. No. 6,376,353, Zhou et al. discloses a method for fabricating wire bond pads on pure copper damascene. The Zhou et al. patent describes processes is which a special Al—Cu bond layer or region is placed on the top of the underlying copper pad metal.

FIG. 1 illustrates a cross-sectional view of semiconductor device with a bonding pad according to a conventional fabrication method. As shown in FIG. 1, a first insulating layer 12 is deposited on a semiconductor substrate 10 with at least a predetermined structure and some part of the first insulating layer 12 is removed through an etching process to form a trench. The trench is filled with a metal material to form a top metal interconnect 14. Here, the top metal interconnect 14 is generally formed of copper.

Then, a second insulating layer 16 is deposited over the substrate 10 including the top metal interconnect 14. Some part of the second insulating layer 16 is removed through photolithography and etching processes using a mask for the formation of a pad. As a result, the top portion of the top metal interconnect 14 is exposed.

Next, a metal layer is formed over the resulting substrate 10 including the second insulating layer 16. Some parts of the metal layer are removed by means of photolithography and etching processes using a mask for the formation of a metal pad (not shown). As a result, the metal pad 18 is formed on the top metal interconnect 14. Here, the top metal interconnect is directly in contact with the metal pad 18. A passivation layer 20 is deposited over the resulting substrate 10 and some part of the passivation layer 20 is removed by means of photolithography and etching processes using the mask for the formation of a pad. Thus, the top portion of the metal pad 18 is exposed through the passivation layer 20.

However, the conventional bonding pad structure described above, the copper interconnect is in direct contact with the bonding pad, which may deteriorate reliability during a wire bonding process to wire bonding pads or reliability tests such as PCT (pressure cooker test) and TC (temperature cycling).

DETAILED DESCRIPTION

As described in greater detail below, an example method for forming a bonding pad of a semiconductor device may be used to obviate problems occurring during a wire bonding process or reliability tests by placing an exposed portion of metal pad on the top of an interlayer insulation layer in forming a bonding pad of a semiconductor device.

As described in greater detail below, an example method of forming a bonding pad of a semiconductor device forms a first insulating layer over a semiconductor substrate with at least a predetermined structure, forms a trench by removing some part of the first insulating layer, forms a top metal interconnect in the trench, and forms a second insulating layer over the substrate including the top metal interconnect. In addition, the example method forms a contact hole by removing some part of the second insulating layer, the contact hole exposing a portion of the top metal interconnect, forms a metal layer on the surface of the second insulating layer and the sidewalls and bottom of the contact hole, and forms a metal pad by removing some parts of the metal layer. Still further, the example method forms a third insulating layer over the second insulating layer and the metal pad, and exposes the metal pad only on the second insulating layer by removing some part of the third insulating layer.

Figure 1:
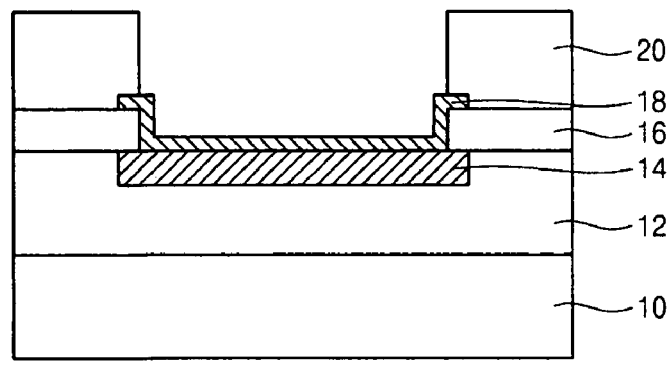
FIG. 1 illustrates a cross-sectional view of semiconductor device with a bonding pad according to a conventional fabrication method.
Figure 2:
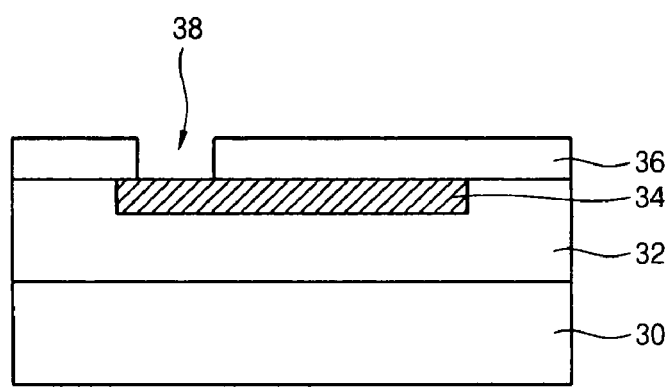
FIGS. 2 through 6 illustrate, in cross-sectional views, an example process for forming an example bonding pad.

Referring to FIG. 2, a semiconductor substrate 30 with at least a predetermined structure is provided. A first insulating layer 32 is deposited over the semiconductor substrate 30. The first insulating layer 32 is preferably formed of $SiO_2$, FSG (fluorinated silica glass), or an insulating material with a low dielectric constant (k), preferably less than 3.0. Some part of the first insulating layer 32 is removed by means of an etching process to form a trench (not shown). Then, the trench is filled with a metal material to form a top metal interconnect 34. The metal material is preferably copper. The trench is preferably filled by means of an electroplating method or an electroless plating method.

Next, a second insulating layer 36 is deposited over the resulting substrate including the top metal interconnect 34. The second insulating layer 36 is preferably formed of $SiO_2$, TEOS (tetraethyl orthosilicate), or SiN. Some part of the second insulating layer 36 is removed by means of photolithography and etching processes using a mask (not shown) for the formation of a pad. As a result, a contact hole 38 is formed through the second insulating layer 36. A portion of the top metal interconnect 34 is exposed through the contact hole 38. The exposed portion of the top metal interconnect 34 is formed to have a minimum size that would not interfere with the transmission of external power.

Figure 3:
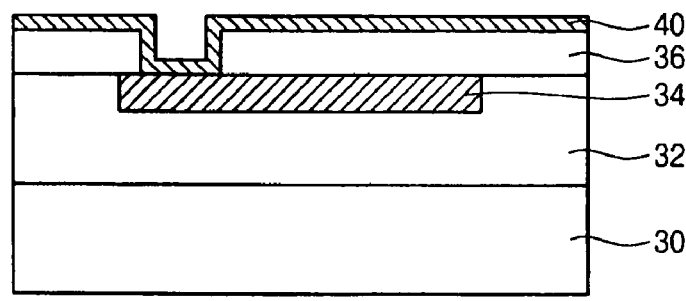

Referring to FIG. 3, a metal layer 40 for a pad is deposited on the surface of the second insulating layer 36 and the sidewalls and the bottom of the contact hole 38. The metal layer 40 is formed to have a minimum thickness that would not interfere with the transmission of external power. The metal layer 40 for the pad is preferably formed of aluminum or tungsten instead of copper, which typically causes corrosion and reliability problems.

Figure 4:
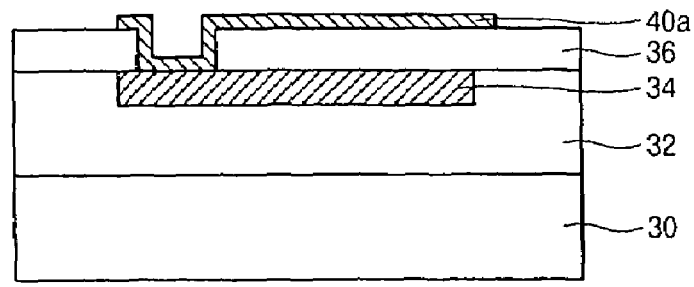

Referring to FIG. 4, some part of the metal layer 40 is removed by means of photolithography and etching processes using a mask (not shown) for the formation of metal pad. As a result, a metal pad 40a is formed. The metal pad 40a is formed as large as possible in size so that a sufficient wire bonding region is ensured in a following process.

In this process, the metal pad 40*a* is formed on the second insulating layer unlike a conventional method that the metal pad is formed on the top metal interconnect. Therefore, in a semiconductor device fabricated using the example method described herein, the top metal interconnect is not influenced although the metal pad is strongly impacted during wire bonding or reliability tests.

Figure 5:
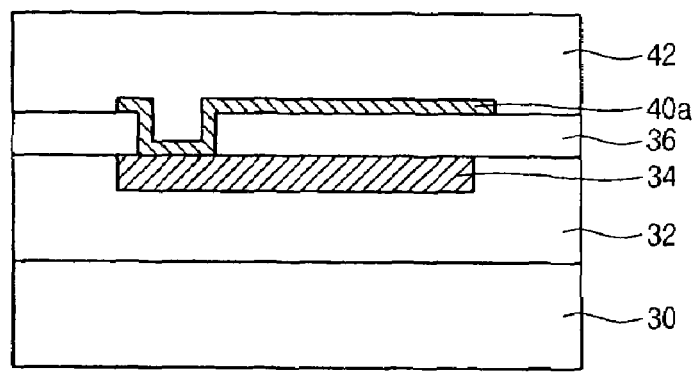

Referring to FIG. 5, a third insulating layer 42 is deposited over the second insulating layer 36 and the metal pad 40*a*. The third insulating layer 36 functions as a passivation layer. The third insulating layer 36 is preferably a single layer of silicon nitride or a multi-layer consisting of oxide and nitride.

Figure 6:
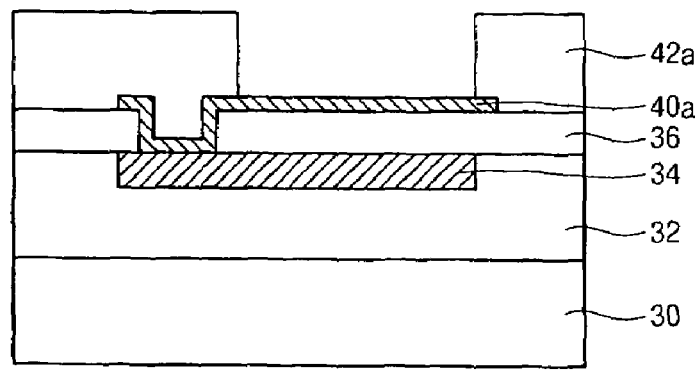

Referring to FIG. 6, some part of the third insulating layer 42 is removed by means of photolithography and etching processes using a second mask (not shown) for the formation of the pad. As a result, a portion of the metal pad 40*a* on the second insulating layer 36 is exposed through the third insulating layer 42.

Accordingly, the example semiconductor pad described herein can obviate problems that may occur during a wire bonding process or reliability tests such as PCT and TC by placing the exposed metal pad on the insulating layer in forming a bonding pad of a semiconductor device with copper interconnect.

Although certain methods and apparatus have been described herein, the scope of coverage of this patent is not limited thereto. To the contrary, this patent covers all embodiments fairly falling within the scope of the appended claims either literally or under the doctrine of equivalents.

What is claimed is:

1. A method of forming a bonding pad of a semiconductor device comprising:

forming a first insulating layer over a semiconductor substrate;

forming a trench by removing some portion of the first insulating layer;

forming a top metal interconnect in the trench;

forming a second insulating layer over the substrate including the top metal interconnect;

forming a contact hole by removing some portion of the second insulating layer, the contact hole exposing a portion of the top metal interconnect;

forming a metal layer on the surface of the second insulating layer and the sidewalls and bottom of the contact hole;

forming a metal pad by removing some portions of the metal layer, wherein the metal pad is extended to some portion of a top surface of the second insulating layer;

forming a third insulating layer over the second insulating layer and the metal pad; and exposing the extended metal pad on the top surface of the second insulating layer by removing some portion of the third insulating layer on the extended metal pad which is in contact with the top surface of the second insulating layer, wherein the exposed metal pad is displaced from the location at which the metal pad structure of the contact hole is attached to the top metal interconnect.

2. The method as defined by claim 1, wherein the top metal interconnect is formed of copper using at least one of electroless plating and electroplating.

3. The method as defined by claim 1, wherein the first insulating layer is formed of at least one of $SiO_2$, FSG (fluorinated silica glass), and an insulating material with a low dielectric constant less than 3.0.

4. The method as defined by claim 1, wherein the second insulating layer is formed of at least one of $SiO_2$, TEOS (tetraethyl orthosilicate), and SiN.

5. The method as defined by claim 1, wherein the third insulating layer functions as a passivation layer.

6. The method as defined by claim 1, wherein the third insulating layer is at least one of single layer and a multi-layer structure.

7. The method as defined by claim 6, wherein the single layer structure is formed of silicon nitride and the multi-layer structure is formed of oxide and nitride.

* * * * *